(12) United States Patent
Hsu et al.

(10) Patent No.: US 12,002,775 B2
(45) Date of Patent: *Jun. 4, 2024

(54) ELECTRONIC DEVICE

(71) Applicant: Innolux Corporation, Miao-Li County (TW)

(72) Inventors: Maggy Hsu, Tainan (TW); Pierre Chen, Tainan (TW)

(73) Assignee: Innolux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/956,029

(22) Filed: Sep. 29, 2022

(65) Prior Publication Data
US 2023/0021718 A1 Jan. 26, 2023

Related U.S. Application Data

(63) Continuation of application No. 17/146,675, filed on Jan. 12, 2021, now Pat. No. 11,488,916.

(51) Int. Cl.
*H01L 23/00* (2006.01)
(52) U.S. Cl.
CPC .............. *H01L 24/05* (2013.01); *H01L 24/13* (2013.01); *H01L 2224/05553* (2013.01); *H01L 2224/05558* (2013.01); *H01L 2224/13021* (2013.01)
(58) Field of Classification Search
CPC ...................... H01L 24/05; H01L 24/13; H01L 2224/05553; H01L 2224/05558; H01L 2224/13021; H01L 24/29; H01L 25/0753; H01L 2224/13017; H01L 2224/293; H01L 2224/32227; H01L 2224/32237; H01L 24/32; H01L 2224/16227; H01L 2224/16237; H01L 2224/83385; H01L 2924/35121; H01L 24/16
See application file for complete search history.

(56) References Cited

U.S. PATENT DOCUMENTS 10,642,118 B2 * 5/2020 Chen ..................... G02F 1/1368
11,488,916 B2 * 11/2022 Hsu ......................... H01L 24/16

* cited by examiner

*Primary Examiner* — Douglas W Owens
(74) *Attorney, Agent, or Firm* — Patterson + Sheridan, LLP (57) ABSTRACT

An electronic device is provided. The electronic device includes a substrate including an active region and a border region adjacent to the active region. The electronic device includes a plurality of pixels disposed in the active region. The electronic device includes a conductive structure disposed in the border region and including a first conductive layer, a second conductive layer, and a third conductive layer disposed between the first conductive layer and the second conductive layer, wherein the third conductive layer overlaps with a part of the first conductive layer and overlaps a part of the second conductive layer. The electronic device includes an insulating layer disposed between the first conductive layer and the second conductive layer, and the insulating layer has a first opening and a second opening through which the first conductive layer and the second conductive layer are electrically connected with each other.

9 Claims, 11 Drawing Sheets

ELECTRONIC DEVICE

CROSS REFERENCE TO RELATED APPLICATIONS

This application is a Continuation of pending U.S. patent application Ser. No. 17/146,675, filed Jan. 12, 2021 and entitled "CONDUCTIVE STRUCTURE AND ELECTRONIC DEVICE COMPRISING THE SAME", the entirety of which is incorporated by reference herein.

BACKGROUND

Technical Field

The present disclosure relates to a conductive structure, and in particular it relates to a conductive structure with multiple openings.

Description of the Related Art

In an electronic device, a conductive structure such as a bonding pad may be used to provide electrical connection between an IC chip and a circuit of the panel. The bonding pad commonly includes a bottom pad (such as a metal pad), a top pad (such as a transparent conductive pad), and an opening (that is via) for electrical connection between the bottom pad and the top pad.

However, due to defects of the bottom pad or particle residue from the cleaning process, adhesion between the top pad and the bottom pad may be reduced to generate a peeling of the top pad. In other cases, when an integrated circuit (IC) chip is squeezed by an external force, and the top pad may peel.

Therefore, existing conductive structures have not been entirely satisfactory in all respects.

SUMMARY

In accordance with some embodiments of the present disclosure, an electronic device is provided. The electronic device includes a substrate including an active region and a border region adjacent to the active region. The electronic device includes a plurality of pixels disposed in the active region. The electronic device includes a conductive structure disposed in the border region and including a first conductive layer, a second conductive layer, and a third conductive layer disposed between the first conductive layer and the second conductive layer, wherein the third conductive layer overlaps with a part of the first conductive layer and overlaps a part of the second conductive layer. The electronic device includes an insulating layer disposed between the first conductive layer and the second conductive layer, and the insulating layer has a first opening and a second opening through which the first conductive layer and the second conductive layer are electrically connected with each other.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The electronic device of the present disclosure is described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. The embodiments are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

The present disclosure can be understood by referring to the following detailed description in connection with the accompanying drawings. It should be noted that, in order to allow the reader to easily understand the drawings, several drawings in the present disclosure only depict a portion of the electronic device, and the specific elements in the drawings are not drawn to scale. In addition, the number and size of each element in the drawings are only for illustration, and are not limited the scope of the present disclosure.

Throughout the present disclosure and the appended claims, certain terms are used to refer to specific elements. Those skilled in the art should understand that electronic device manufacturers may refer to the same element with different names. The present disclosure does not intend to distinguish between elements that have the same function but different names. In the specification and claims, the terms "comprising", "including", "having" and the like are open-ended phrases, so they should be interpreted as "including but is not limited to . . . ". Therefore, when the terms "comprising", "including" and/or "having" are used in the description of the present disclosure, they specify the corresponding features, regions, steps, operations and/or components, but do not exclude the existence of one or more corresponding features, regions, steps, operations and/or components.

It should also be understood that when a component is said to be "coupled" or "connected" to another component (or a variant thereof), it may be directly connected to another component or indirectly connected (e.g., electrically connected) to another component through one or more components.

Directional terms mentioned in the present disclosure, such as "upper", "lower", "front", "rear", "left", "right", etc., are only the directions referring to the drawings. Therefore, the directional terms are used for illustration, not for limiting the present disclosure. In the drawings, each drawing depicts general features of methods, structures, and/or materials used in particular embodiments. However, these drawings should not be interpreted as defining or limiting the scope or property encompassed by these embodiments. For example, for clarity, the relative sizes, thicknesses, and positions of the various layers, regions, and/or structures may be reduced or enlarged.

When a corresponding component (such as a layer or a region) is referred to as "(disposed, located or formed) on another component", it may be directly (disposed, located or formed) on another component, or there may be other components between them. On the other hand, when a component is referred to as "directly (disposed, located or formed) on another component", there is no component existing between them. In addition, when a component is referred to as "(disposed, located or formed) on another component", the two have an upper-lower relationship in a top-view direction, and this component may be above or below another component, and the upper-lower relationship depends on the orientation of the device.

When a component (such as a layer) is referred to as "(disposed or located) between a component A and a component B", it may be directly (disposed or located) between the component A and the component B (e.g. the component is in direct contact with the components A and B), or there may be other components between them.

When a component (such as a layer) is referred to as "sandwitched between a component A and a component B", it may be directly (disposed or located) between the component A and the component B, there is no component existing between them.

The terms "about", "equal to", "the same as", "identical to", "substantially" or "approximately" are generally interpreted as being within 20% of a given value or range, or within 10%, 5%, 3%, 2%, 1% or 0.5% of the given value or range.

The ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is used to make a component with a certain name can be clearly distinguished from another component with the same name. The same words may not be used in the claims and the specification. Accordingly, the first component in the specification may be the second component in the claims.

It should be noted that the following embodiments can replace, recombine, and mix features in several different embodiments to complete other embodiments without departing from the spirit of the present disclosure. The features between the various embodiments can be mixed and used arbitrarily as long as they do not violate or conflict the spirit of the present disclosure.

In the present disclosure, the length and the width of the component can be measured from an optical microscope image, and the thickness of the component can be measured from a cross-sectional image in an electron microscope, but it is not limited thereto. In addition, certain errors may exist between any two values or directions used for comparison. If the first value is equal to the second value, it implies that there may be an 10% error between the first value and the second value; if the first direction is perpendicular to the second direction, the angle between the first direction and the second direction may be between 80 degrees and 100 degrees; if the first direction is parallel to the second direction, the angle between the first direction and the second direction may be between 0 degrees and 10 degrees.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, the electronic device may include a display device, a light-emitting device, a touch device, a sensing device, an antenna device or a tiled device (a tiled device having any of the above functions or a hybrid function), but it is not limited thereto. The electronic device may include a bendable electronic device or a flexible electronic device, but it is not limited thereto. For example, the electronic device may include, liquid-crystal, light-emitting diode (LED), quantum dot (QD), fluorescence, phosphor, other suitable materials or a combination thereof. For example, the light-emitting diode may include organic light-emitting diode (OLED), micro-LED, micro-LED, mini-LED or quantum dot light-emitting diode (QLED, QDLED), but it is not limited thereto. In some embodiments, the electronic device may include a panel and/or a backlight module. The panel includes a liquid-crystal panel, but it is not limited thereto.

Figure 1:
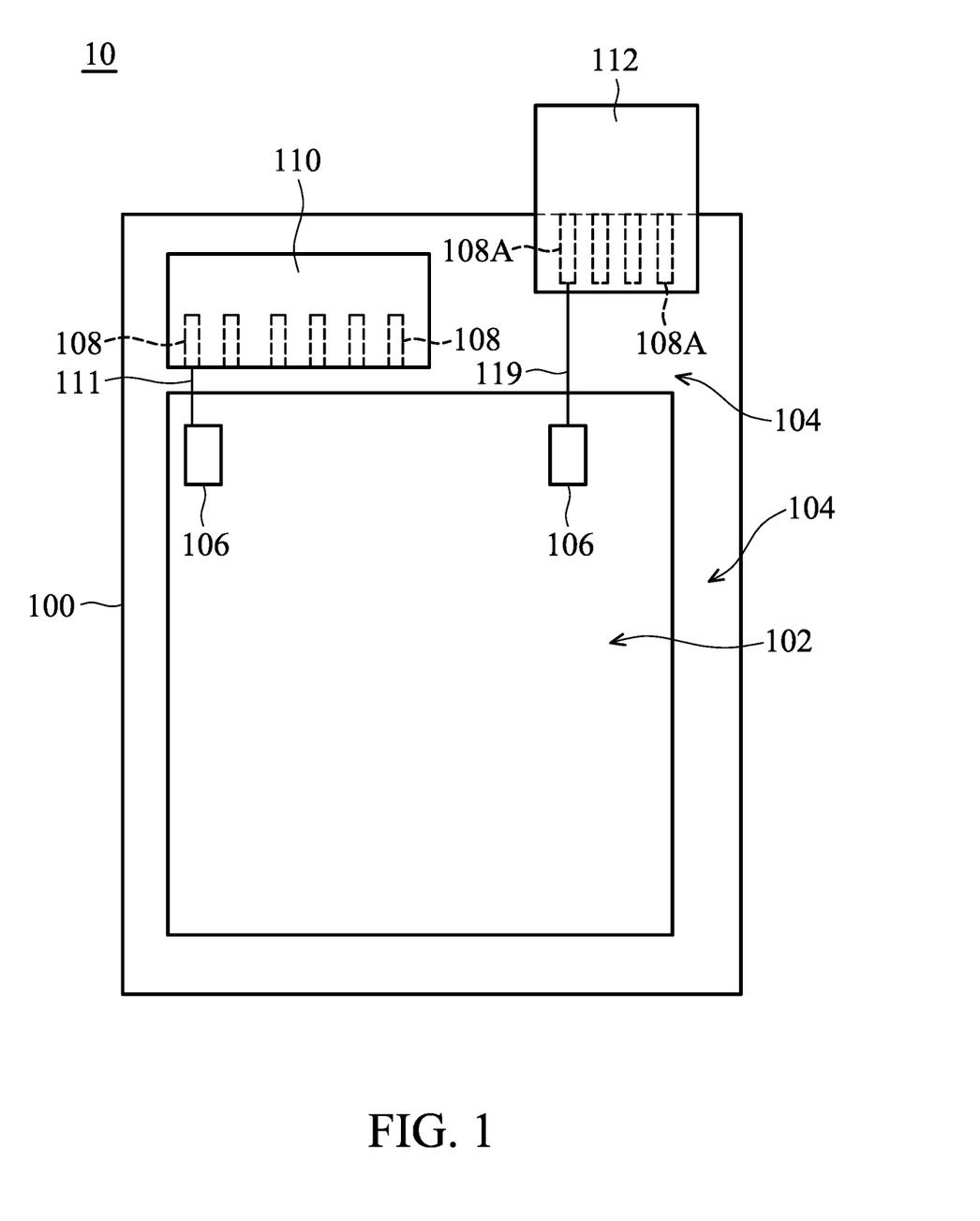
FIG. 1 is a schematic partial top-view diagram of an electronic device in accordance with some embodiments of the present disclosure.

FIG. 1 is a schematic partial top-view diagram of an electronic device 10 in accordance with some embodiments of the present disclosure. It should be understood that, some elements in the electronic device 10 are omitted in FIG. 1, and only some elements formed or disposed on the substrate 100 are schematically shown for clarity. In some embodiments, additional features or elements may be added to the electronic device 10. In some embodiments, some features of the electronic device 10 described below may be optionally replaced or omitted.

Referring to FIG. 1, the electronic device 10 may include a substrate 100 and some elements disposed on the substrate 100. In some embodiments, the substrate 100 may be an array substrate, but it is not limited thereto. In FIG. 1, the substrate 100 may include an active region 102 and a border region 104 adjacent to the active region 102, and the plurality of pixels 106 are disposed in the active region 102. The electronic device 10 may include a plurality of conductive structures (such as the conductive structures 108 or the conductive structures 108A). A plurality of conductive structures 108 may be disposed on the substrate 100 and in the border region 104. Referring to the left side of FIG. 1, at least one IC chip 110 may be disposed on the border region 104, and the IC chip 110 may be disposed on the conductive structures 108. The IC chip 110 may be electrically connected to the pixels 106 through the the conductive structures 108. For example, the conductive structure 108 may be electrically connected to the pixel 106 through the corresponding signal line(s) 111 (such as a scan line or a data line), and the electrical signal supplied from the IC chip 110 may be transmitted to the pixel 106 through the conductive structure 108 and/or the corresponding signal line(s) 111. In some embodiments, the conductive structures 108 corresponding to the IC chip 100 can be used as chip on glass (COG) bonding pads.

Referring to the right side of FIG. 1, a circuit board 112 may be disposed on the border region 104, the circuit board 112 corresponds to the conductive structures 108A. The circuit board 112 may be a flexible printed circuit (FPC) or a chip-on-film (COF), but it is not limited. The circuit board 112 may be electrically connected to the pixels 106 through the the conductive structures 108A. For example, the conductive structure 108A may be electrically connected to the pixel 106 through the corresponding signal line(s) 119 (such as a scan line or a data line), and the electrical signal supplied from the circuit board 112 may be transmitted to the pixel 106 through the conductive structure 108A and/or the corresponding signal line(s) 119. The conductive structures 108A corresponding to the circuit board 112 can be used as chip-on-film (COF) bonding pads. The detailed structure of the conductive structure (such as the conductive structure 108 or the conductive structure 108A) disposed in the border region 104 is described in the embodiment of FIGS. 2 and 3.

In some embodiments, the electronic device 10 may include at least one kind of the conductive structure 108 (used as COG bonding pad) and the conductive structure 108A (used as COF bonding pad), but not limited thereto.

Figure 2:
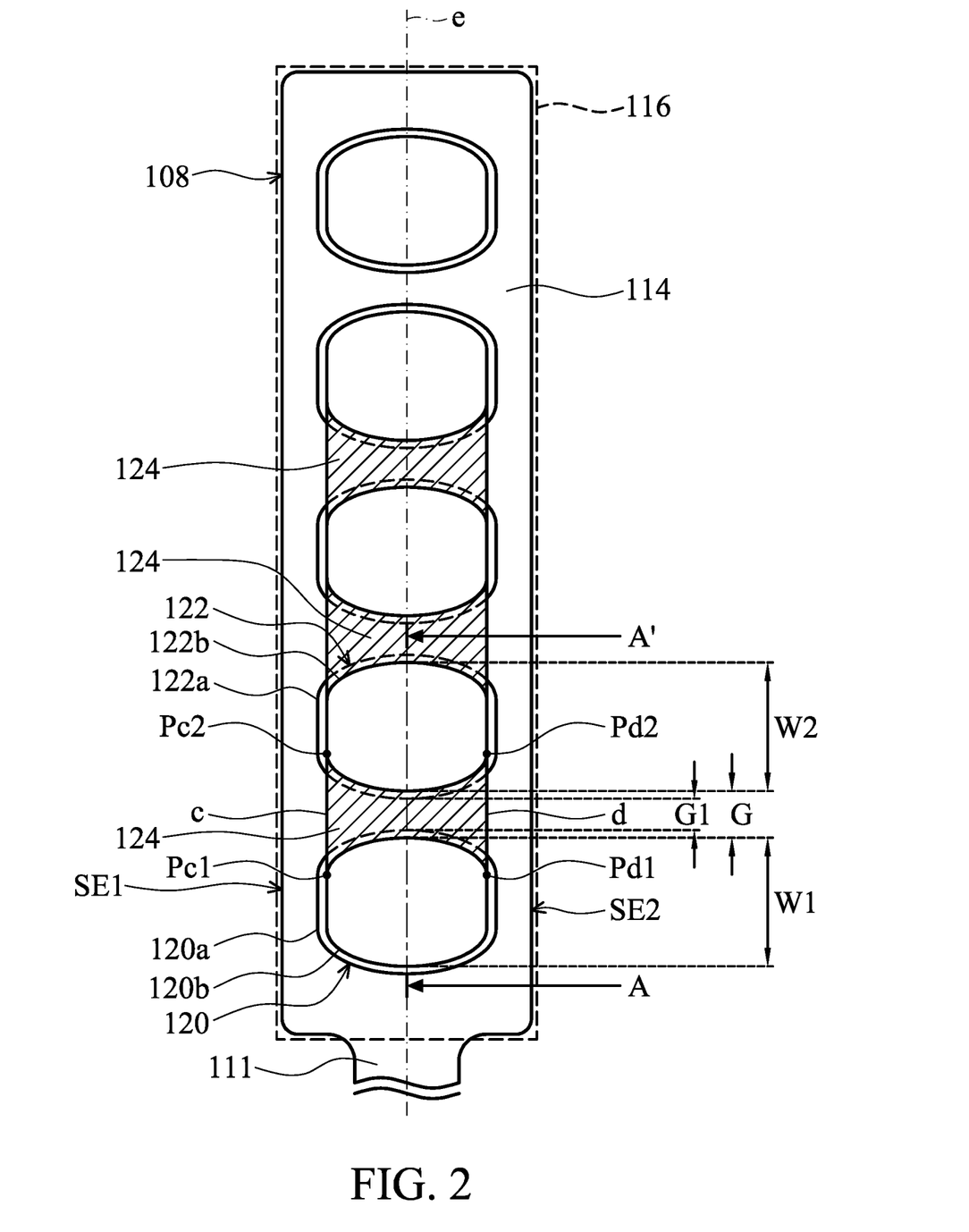
FIG. 2 is a schematic partial top-view diagram of a conductive structure in accordance with some embodiments of the present disclosure.
Figure 3:
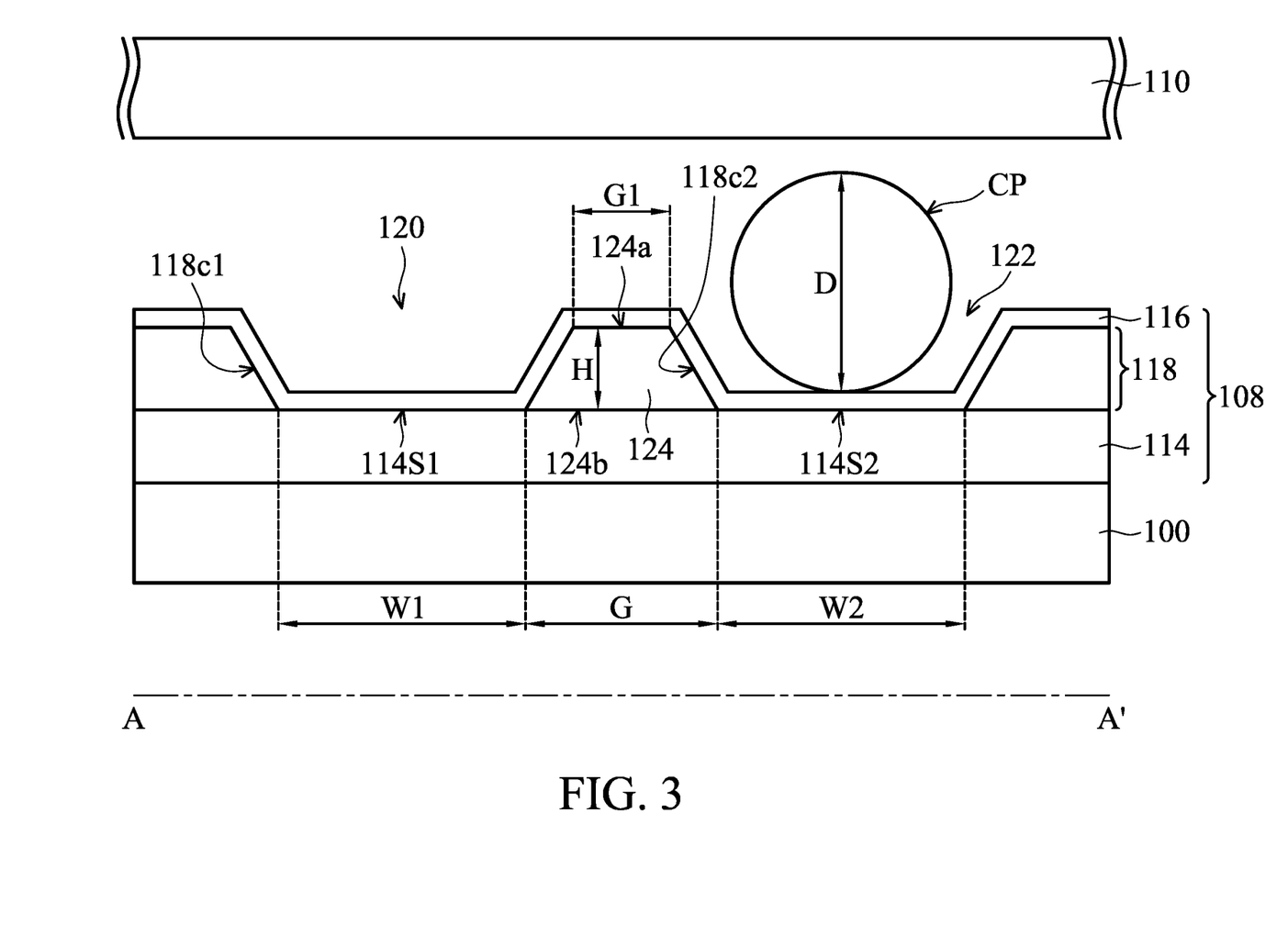
FIG. 3 is a schematic cross-sectional diagram of an electronic device haveing a conductive structure taken along a sectional line A-A' in the embodiment of FIG. 2 of the present disclosure.

FIG. 2 is a schematic partial top-view diagram of the conductive structure 108 in accordance with some embodiments of the present disclosure. FIG. 3 is a schematic cross-sectional diagram of an electronic device haveing the conductive structure 108 taken along a sectional line A-A' in the embodiment of FIG. 2. In FIGS. 2 and 3, the conductive structure 108 may include a first conductive layer 114, a second conductive layer 116, and an insulating layer 118 sandwiched between (or disposed between) the first conductive layer 114 and the second conductive layer 116. The insulating layer 118 may have a first opening 120 and a second opening 122 through which the first conductive layer 114 and the second conductive layer 116 may be electrically connected with each other. A partition 124 is disposed between the first opening 120 and the second opening 122 from a top view. In some examples, the partition 124 may be a portion of the insulating layer 118, but not limited thereto. In some embodiments, the first conductive layer 114 may be a metal pad, and the second conductive layer 116 may be a transparent conductive pad, but it is not limited thereto. In some embodiments, the material of the first conductive layer 114 and the material of the second conductive layer 116 may include metal, alloy, transparent conductive material, other suitable material or a combination thereof, but it is not limited thereto. In some embodiments, the first conductive layer 114 and/or the second conductive layer 116 may be single-layered or multi-layered.

In some embodiments, the first opening 120 and the second opening 122 may be used as the vias for electrical connection. In some embodiments, the first conductive layer 114 may be electrically connected to or in contact with the second conductive layer 116 through some openings (such as the first opening 120 and the second opening 122, but not limited thereto).

In some embodiments, the first conductive layer 114 of the conductive structure 108 may be electrically connected to the signal line 111, and the first conductie layer 114 and the signal line 111 may include the same conductive layer, and the first conductive layer 114 may be defined by a portion of the conductive layer having a width which begins to increase.

In FIGS. 2 and 3, in some embodiments, the first conductive layer 114 has a first contacting surface 114S1 exposed through the first opening 120, the second conductive layer 116 may be in contact with or electrically connected to the first contacting surface 114S1 through the first opening 120. In some embodiments, the insulating layer 118 has a sidewall 118c1 surrounding the first contacting surface 114S. In some embodiments, the first conductive layer 114 has a second contacting surface 114S2 exposed through the seccond opening 122, the second conductive layer 116 may be in contact with or electrically connected to the second contacting surface 114S2 through the seccond opening 122. In some embodiments, the insulating layer 118 has a sidewall 118c2 surrounding the second contacting surface 114S2. In some embodiments, the first opening 120 may have a width W1, and the width W1 may be defined by a maximum width of an inner contour 120b of the first opening 120 from a top view, the width W1 is approximately the same as a maximum width of the first contacting surface 114S1 of the first conductive layer 114 exposed through the first opening 120.

In some embodiments, the second opening 122 may have a width W2, and the width W2 may be defined by a maximum width of an inner contour 122b of the second opening 122, the width W2 is approximately the same as a maximum width of the second contacting surface 114S2 of the first conductive layer 114 exposed through the second opening 122. In some embodiments, the first conductive layer 114 may be electrically connected to and/or in contact with the second conductive layer 116 through the first opening 120 and/or the second opening 122, but not limted thereto.

In some embodiments, the width W1 of the first opening 120 and the second width W2 of the second opening 122 may have an average width W (i.e. W=(W1+W2)/2).

In some embodiments, the partition 124 may be disposed between the first opening 120 and the second opening 122, and the partition 124 may be defined by a bulk enclosed by a line segment c, a line segment d, a part of an inner contour 120b of the first opening 120 and a part of an inner contour 122b of the second opening 122 from a top view, as shown in FIG. 2. The inner contour 120b of the first opening 120 may correspond to a contour of the first contacting surface 114S1, and the inner contour 122b of the second opening 122 may correspond to a contour of the second contacting surface 114S2.

The line segment c may be defined by a connecting line between the point Pc1 and the point Pc2, and the line segment d may be defined by a connecting line between the point Pd1 and the point Pd2. The point Pci may be defined by a point corresponding to the inner contour 120b of the first opening 120 nearest to a long side edge SE1 of the first conductive layer 114 and closest to the second opening 122.

The point Pc2 may be defined by a point corresponding to the inner contour 122b of the second opening 122 nearest to the long side edge SE1 of the first conductive layer 114 and closest to the first opening 120. Similarly, the point Pd1 may be defined by a point corresponding to the inner contour 120b of the first opening 120 nearest to a long side edge SE2 of the first conductive layer 114 and closest to the second opening 122, and the long side edge SE2 is opposited to the long side edge SE1. The point Pd2 may be defined by a point corresponding to the inner contour 122b of the second opening 122 nearest to the long side edge SE2 of the first conductive layer 114 and closest to the first opening 120.

In FIGS. 2 and 3, in some embodiments, the partition 124 between the first opening 120 and the second opening 122 may has a top surface 124a and a bottom surface 124b. In some embodiments, the top surface 124a of the partition 124 may have a width G1, and the bottom surface 124b of the partition 124 may have a width G. In some embodiments, a ratio of the width G1 of the top surface 124a to a width G of the bottom surface 124b of the partition 124 is greater than or equal to 0.2 and less than or equal to 1 (i.e. $0.2 \leq G1/G \leq 1$). The width G of the bottom surface 124b of the partition 124 may be approximately the same as a minimum distance between the inner contour 120b of the first opening 120 and the inner contour 122b of the second opening 122 from the top view. The width G1 of the top surface 124a of the partition 124 may be approximately the same as a minimum distance between an outer contour 120a of the first opening 120 and an outer contour 122a of the second opening 122 from the top view. Specifically, the width W1 of the first opening 120, the width W2 of the second opening 122, the width G1 of the top surface 124a of the partition 124 and the width G of the bottom surface 124b of the partition 124 are measured based on the same virtual extension line e through the first opening 120 and the second opening 122 from the top view. The virtual extension line e may be approximately parallel to the long side edge SE1 or the long side edge SE2 of the first conductive layer 114, but not limited thereto.

In some embodiments, the width G1 of the top surface 124a of the partition 124 may be greater than 0 (such as 0 µm) and less than or equal to the average width W of the first opening 120 and the second opening 122 (i.e. $0<G1 \leq W$). In some embodiments, a ratio of the width G1 of the top surface 124a of the partition 124 to the average width W of the first opening 120 and the second opening 122 may be not less than 0.1 and less than or equal to 1 (i.e. $0.1 \leq G1/W \leq 1$), such as 0.15, 0.25, 0.35, 0.55, 0.65 or 0.78, but not limited thereto.

In some embodiments, a ratio of the width G1 of the partition 124 to the average width of the first opening 120 and second opening 122 may be not less than 0.2 and not more than 0.85 (i.e. $0.2 \leq G1/W \leq 0.85$).

In some embodiments, the width G of the bottom surface 124b of the partition 124 may be greater than 0 (such as 0 µm) and less than or equal to the average width W of the first opening 120 and the second opening 122 (i.e. $0<G \leq W$). In some embodiments, the ratio of the width G of the bottom surface 124b of the partition 124 to the average width W of the first opening 120 and the second opening 122 may be greater than 0 and less than or equal to 1 (i.e. $0<G/W \leq 1$). In some embodiments, the ratio of the width G of the bottom surface 124b of the partition 124 to the average width W of the first opening 120 and the second opening 122 may be not less than 0.1 and not more than 0.85 (i.e. $0.1 \leq G/W \leq 0.85$).

In some embodiments, the average width W of the first opening 120 and the second opening 122 may be in a range between 5 µm and 30 µm ((i.e. 5 µm$\leq$W$\leq$30 µm), such as 8 µm, 10 µm, 13 µm, 17 µm, 20 µm, or 23 µm, but it is not limited thereto. In some embodiments, the width G of the partition 124 may be in a range between 2 µm and 13 µm (2 µm$\leq$W$\leq$13 µm), but it is not limited thereto.

The partition 124 formed between the first opening 120 and the second opening 122 adjacent to the first opening 120 can be used as a peeling stopper. When the peeling occurs on the second conductive layer 116, the partition 124 can reduce the peeling of the second conductive layer 116 expanded to the adjacent openings. The second conductive layer 116 may be electrically connected to the first conductive layer 114 through the openings (such as the first opening 120 and the second opening 122) to transmit the signals provided from the IC chip 100, and the design "$0<G/W \leq 1$" can achieve better conductivity. If G/W=0, there is no partition (e.g. the partition 124) formed between the adjacent openings (such as the first opening 120 and the second opening 122) as a peeling stopper. If G/W>1, it may mean that another opening can be inserted a space between the adjacent openings (such as the first opening 120 and the second opening 122), the space where the another opening can be formed or inserted may be wasted and/or the conductivity may be reduced. In addition, when the length of the long side edge SE1 of the first conductive layer 114 and/or a number of the openings are fixed, the design "$0.1 \leq G/W \leq 0.85$" can achieve better adhesion between the partition and the second conductive layer 116, or achieve more contact area between the second conductive layer 116 and the first conductive layer 114 for improving the conductivity.

In FIG. 2, the partition 124 is in a curve shape from a top view. For example, a portion of the profile of the partition 124 is curved from the top view, but not limited thereto. If the corner of the opening (or the partition) does not have the curved edges, the second conductive layer 116 may be easily peeled. Therefore, the design of the partition 124 is in a curve shape from the top view can reduce the occurrence of the peeling.

In some embodiments, the conductive structure may include a plurality of partitions 124, for example, the number of the plurality of partitions 124 of the conductive structure 108 may be greater than or equal to 2 and less than or equal to 12 ($2 \leq number \leq 12$), such as 4, 6 or 8, but not limted thereto. In some embodiments, the number of the plurality of partitions 124 of the conductive structure 108 may be greater than or equal to 3 and less than or equal to 10 ($3 \leq number \leq 10$). In some embodiments, the number of the partitions 124 is designed to be at least two, which can improve the yield of the conductive structure 108. As the number of the conductive structures 108 of the electronic device is increased or a width of the border region 104 of the electronic device may be reduced, the length of the first conductive layer 114 and/or the width of the first conductive layer 114 may be limited. Under the design "$0<G/W \leq 1$", if the number of the partitions is too large (or the number of the openings is too large), the contact area between the second conductive layer 116 and the first conductive layer 114 may be compressed.

In FIG. 3, the ratio of the width G1 of the top surface 124a of the partition 124 to the width G of the bottom surface 124b of the partition 124 may be greater than or equal to 0.2 and less than or equal to 1 (i.e. $0.2 \leq G1/G \leq 1$), such as 0.4, 0.6 or 0.9, but not limited thereto. In some embodiments, the ratio of the width G1 of the top surface 124a of the partition 124 to the width G of the bottom surface 124b of the partition 124 may be greater than or equal to 0.3 and less than or equal to 0.8 (i.e. $0.3 \leq G1/G \leq 0.8$).

Figure 4:
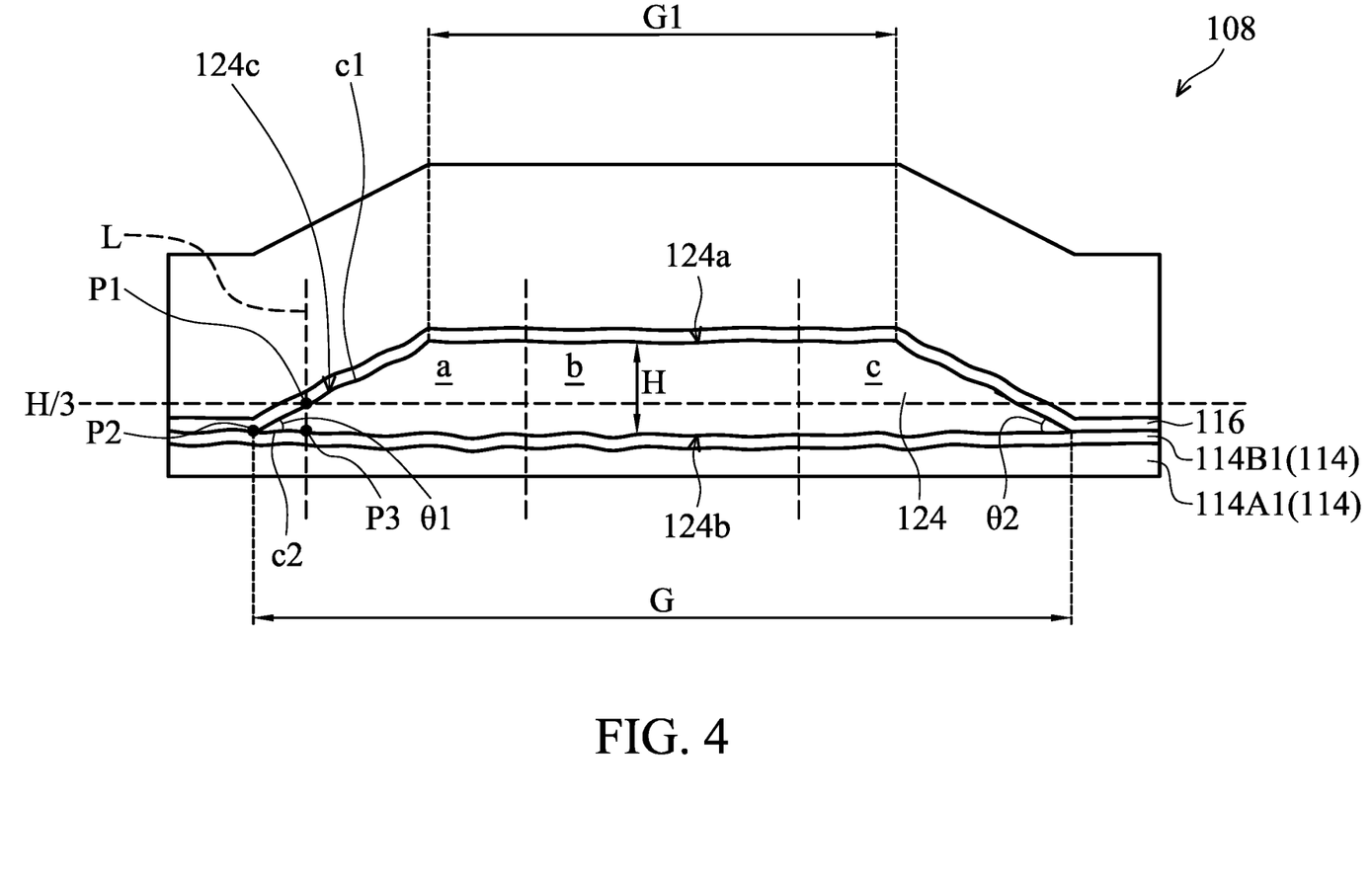
FIG. 4 is a partial cross-sectional diagram of a conductive structure in accordance with some embodiments of the present disclosure.

When the width G of the bottom surface 124b of the partition 124 and the height H of the partition 124 are fixed, if G1/G<0.2 (i.e. G1 is too small), the adhesion of the second conductive layer 116 on the partition may be decreased or the peeling of the second conductive layer 116 may be prone to occur. This peeling of the second conductive layer 116 may expand to the openings to affect the conductivity. If G1/G>1, the partition may be an inverted trapezoid from a cross-sectional view. In other word, a projection of the top surface 124a of the partition 124 onto the substrate 100 may protrude beyond a projection of the bottom surface 124b of the partition 124 onto the substrate 100, and the second conductive layer 116 may easily crack, or the second conductive layer 116 may be difficult to cover the contacting surface (such as the first contacting surface 114S1 or the second contacting surface 114S2) exposed through the corresponding opening of the insulating layer 118, and a part of the first conductive layer 114 may be not covered by the second conductive layer 116. The above conditions may cause moisture intrusion and/or oxidation. Other relevant dimensions of the partition 124 are disclosed in FIG. 4. According to FIG. 4, the partition 124 may be in a taper shape from the cross-sectional view. but it is not limited thereto. The partition 124 may be approximately divided into three parts (such as the part a, the part b and the part c), the part b may be a central part between the part a and the part c, and the widths of the part a, the part b and the part c may approximately be the same from a cross-sectional view. In one embodiment, the average height H of the partition 124 may be obtained by averaging any three heights measured in the part b. The point P1 may be a point on a sidewall 124c of the partition 124 at approximately H/3. In one embodiment, the sidewall 124c of the partition 124 may correspond to a part of sidewall (such as the sidewall 118c1 or the the sidewall 118c2) of the insulating layer 118, and the sidewall 124c of the partition 124 may connect between the bottom surface 124b of the partition 124 and the top surface 124a of the partition 124. The point P2 may be a point where the first conductive layer 114 and the second conductive layer 116 start to contact with each other. The point P3 may be a point where a virtual vertical line L extends through the point P1 and intersects the first conductive layer 114. The first bottom angle θ1 (i.e. the left bottom angle of the partition 124) may be defined by an included angle between a line c1 and a line c2, wherein the line c1 is a connecting line between the point P1 and the point P2, and the line c2 is a connecting line between the point P2 and the point P3. The second bottom angle θ2 (i.e. the right bottom angle of the partition 124) may be obtained in a similar way as defining the first bottom angle θ1. In some embodiments, the first bottom angle θ1 and/or the second bottom angle θ2 of the partition 124 may be greater than 0 degrees and less than or equal to 90 degrees (i.e. 0 degrees<θ1≤90 degrees; 0 degrees<θ2≤90 degrees), such as 20 degrees, 40 degrees, or 60 degrees, but not limited thereto. In some embodiments, the first bottom angle θ1 and/or the second bottom angle θ2 of the partition 124 may be greater than or equal to 10 degrees and less than or equal to 70 degrees (i.e. 10 degrees≤θ1≤70 degrees; 10 degrees≤θ2≤70 degrees). In some embodiments, the first bottom angle θ1 may be different from the second bottom angle θ2, but not limited thereto. If the bottom first angle θi and the second bottom angle θ2 of the partition 124 are equal to 0 degrees, there is no partition as a peeling stopper. If the first bottom angle θ1 and/or the second bottom angle θ2 of the partition 124 is greater than 90 degrees, the partition 124 will be an inverted trapezoid from a cross-sectional view, a projection of the top surface 124a of the partition 124 onto the substrate 100 may protrude beyond a projection of the bottom surface 124b of the partition 124 onto the substrate 100, and the second conductive layer 116 may easily crack, or the second conductive layer 116 may be difficult to cover an entire contacting surface (such as the first contacting surface 114S1 or the second contacting surface 114S2) exposed through the corresponding opening of the insulating layer 118, and a part of the first conductive layer 114 may be not covered by the second conductive layer 116. The above conditions may cause moisture intrusion and/or oxidation In some embodiments, the partition 124 may have an average height H greater than 0 and less than 2 μm (0 μm<H<2 μm). The average height H of the partition 124 may be obtained by averaging any three heights in the part b (as aforementioned). If the average height H of the partition 124 is equal to 0 there is no partition as a peeling stopper. The larger average height H can reduce the peeling of the second conductive layer 116 transmitting from one opening to the adjacent openings, but it may not be higher than a diameter D (about 2-5 μm, but it is not limited) of one of the conductive particles CP shown in FIG.3. Therefore, when H<D, the conductive particles CP can be appropriately compressed to achieve better conductivity. In FIG.4, the conductive structure 108 may include a first conductive layer 114 and a second conductive layer 116, the first conductive layer 114 may include multiple layers, but not limited thereto. For example, the first conductive layer 114 may include a first sub-layer 114A1 and a second sub-layer 114B1 (directly) disposed on the first sub-layer 114A1. In some embodiments, the first sub-layer 114A1 and the second sub-layer 114B1 may respectively include the metal material, and the material of the first sub-layer 114A1 may be different from the material of the second sub-layer 114B1. For example, the first sub-layer 114A1 may include molybdenum (Mo), and the second sub-layer 114B1 may include aluminum (Al), but not limited thereto.

Figure 5:
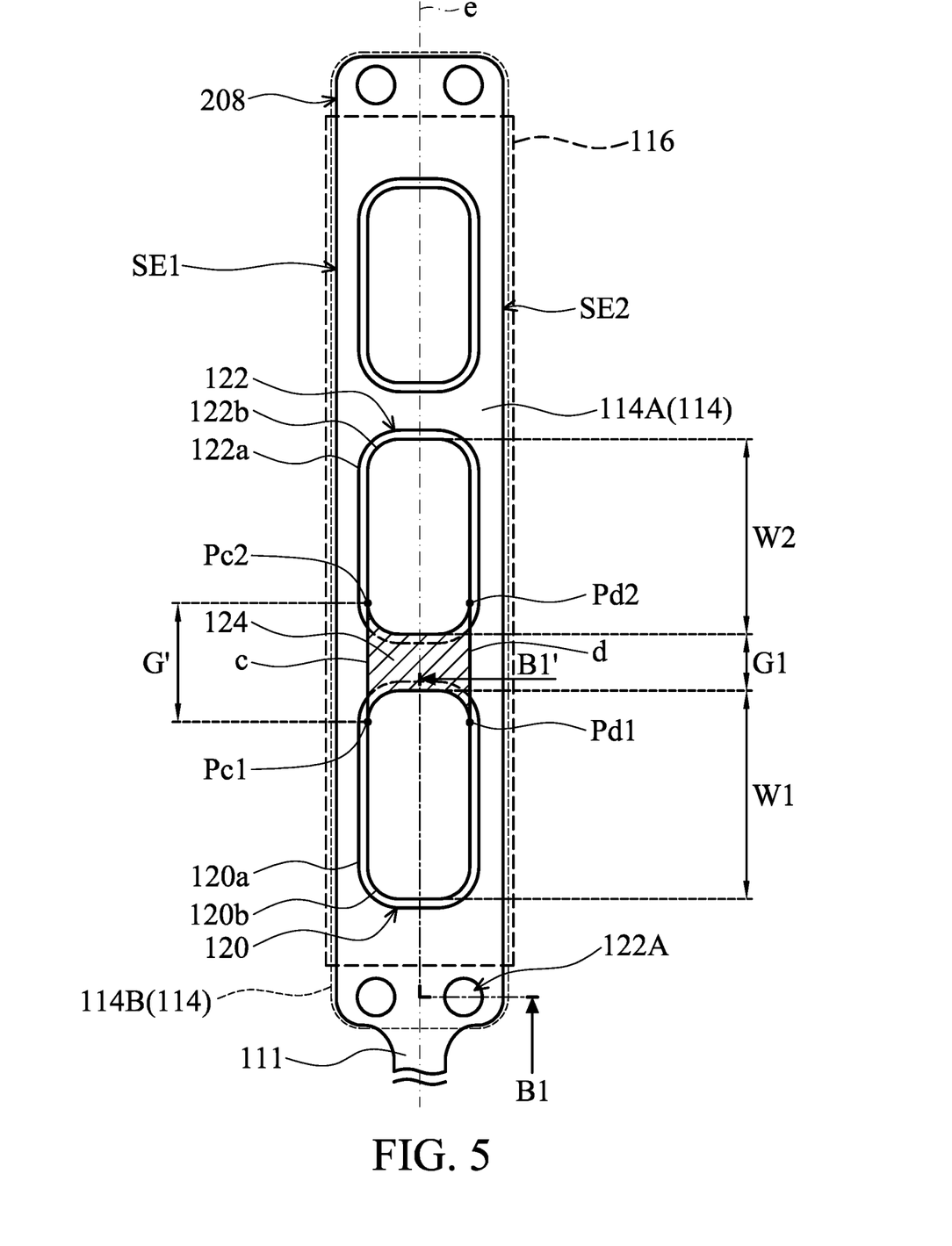
FIG. 5 is a schematic partial top-view diagram of a conductive structure in accordance with some embodiments of the present disclosure.
Figure 6:
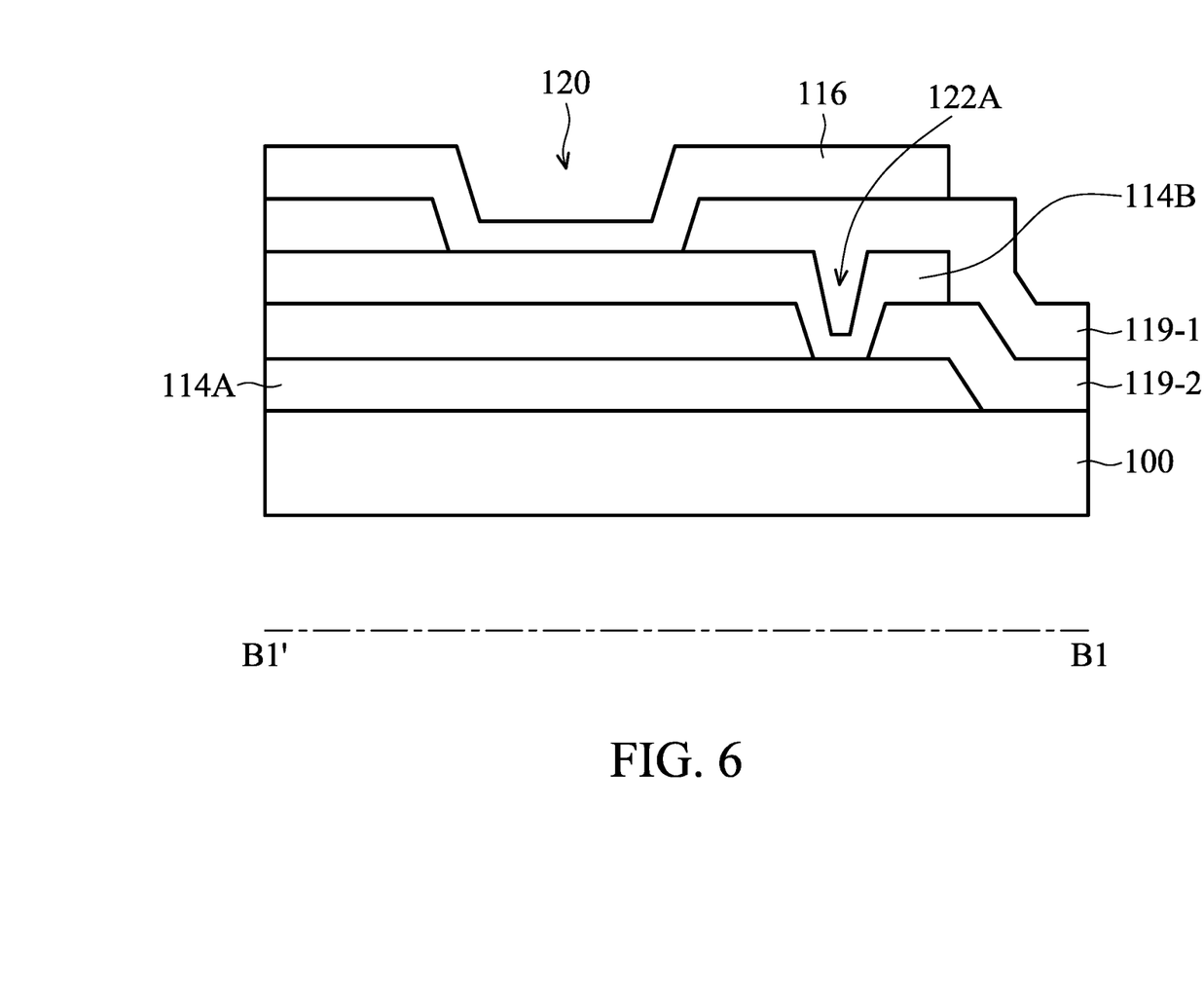
FIG. 6 is a schematic cross-sectional diagram of a conductive structure taken along a sectional line B1-B1' in the embodiment of FIG. 5 of the present disclosure.

Referring to FIGS. 5 and 6, in accordance with some embodiments of the present disclosure, a conductive structure 208 is provided. FIG. 5 is a schematic partial top-view diagram of the conductive structure 208 in accordance with some embodiments of the present disclosure. FIG. 6 is a schematic cross-sectional diagram of a conductive structure taken along a sectional line B1-B1' in the embodiment of FIG. 5 of the present disclosure.

Since the elements or the layers in the conductive structure 208 are similar to the elements or the layers in the conductive structure 108, the elements or the layers may be used the same numerals, and the description is not repeated hereinafter.

Referring to FIGS. 5 and 6, the conductive structure 208 may include a first conductive layer 114 and a second conductive layer 116, the first conductive layer 114 may include a first sub-layer 114A and a second sub-layer 114B disposed on the first sub-layer 114A, and the first sub-layer 114A may overlap with the second sub-layer 114B. In some embodiments, the first sub-layer 114A may be electrically connected to the signal line 111 (such as the scan line or the data line). In some embodiments, the first sub-layer 114A and the signal line 111 may include the same conductive layer, and the first sub-layer 114A may be defined by a portion of the conductive layer having a width which begins to increase. In some embodiments, the conductive structure 108 may include a first insulating layer 119-2 and a second insulating layer 119-1, the first insulating layer 119-2 may be disposed between the first sub-layer 114A and the second sub-layer 114B, and the second insulating layer 119-1 may be disposed between the the second sub-layer 114B and the second conductive layer 116, but it is not limited.

The first insulating layer 119-2 may have at least one opening 122A through which the first sub-layer 114A and the second sub-layer 114B are electrically connected to each other. In some embodiments, the second insulating layer 119-1 may have some openings (such as the first opening 120 and the second opening 122) through which the second sub-layer 114B of the first conductive layer 114 and the second conductive layer 116 may be electrically connected with each other. A partition 124 may be disposed between the first opening 120 and the second opening 122. In other word, the first opening 120 and the second opening 122 may be used as vias for electrical connection between the first conductive layer 114 and the second conductive layer 116.

Referring to FIG. 5, in some embodiments, the partition 124 may have a maximum width G' greater than 0 and less than or equal to the average width of the first opening 120 and second opening 122 ($0<G'\le W$). The maximum width G' of the partition 124 may be defined by a distance between the point Pc1 and the point Pc2 or a distance between the point Pd1 and the point Pd2. The maximum width G' of the partition 124 may be measured along the line segment c (or the line segment d). The point Pc1, the point Pc2, the point Pd1 and the point Pd2 may be defined by the similar way as described above in FIG. 2.

If G'=0, there is no partition (e.g. the partition 124) formed between the adjacent openings (such as the first opening 120 and the second opening 122) as a peeling stopper. Since the second conductive layer 116 may be electrically connected to the first conductive layer 114 through the openings to transmit the signals provided from the IC chip 110, the design "$0<G'\le W$" can achieve better conductivity. In addition, the maximum width G' may be greater than the width G (i.e. G<G'), and the design may reduce the peeling of the second conductive layer 116 transmitting from one opening to the adjacent openings.

It should be noted that, the definitions of some parameters (such as the number of the partitions 124, the width W1 of the first opening 120, the width W2 of the second opening 122, the width G1 of the partition 124, the width G of the partition 124, the maximum width G' of the partition 124, the average height H of the partition 124 . . . ) and/or the relationship between the parameters may be the same or similar in different embodiments of the disclosure, and the description or the advantage will not be repeated herein. In FIG. 5, the partition 124 may be in a curve shape from a top view. The design of the partition with curved edges can reduce the occurrence of peeling.

Figure 7:
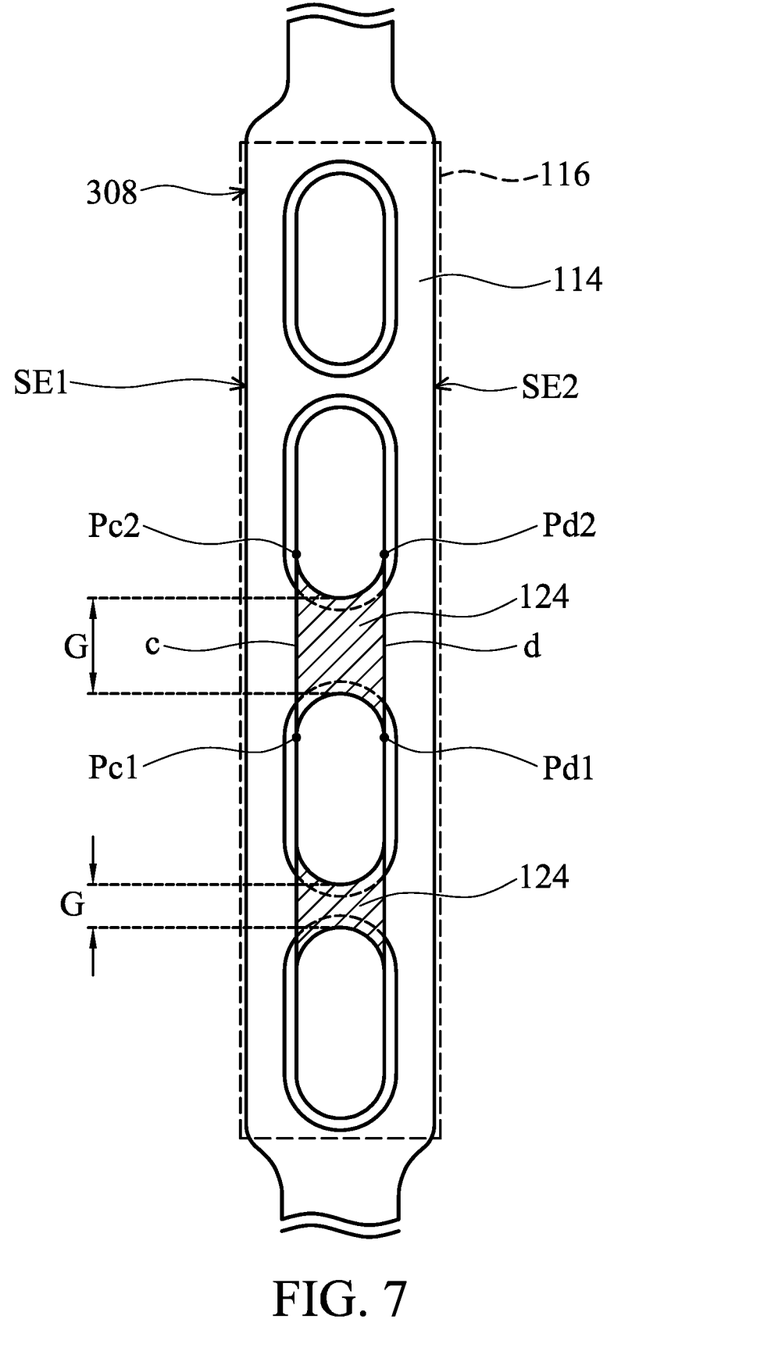
FIG. 7 is a schematic partial top-view diagram of a conductive structure in accordance with some embodiments of the present disclosure.

Referring to FIG. 7, in accordance with some embodiments of the present disclosure, a conductive structure 308 is provided. FIG. 7 is a schematic partial top-view diagram of the conductive structure 308. Since the elements or the layers in the conductive structure 308 are similar to the elements or the layers in the conductive structure 108, the elements or the layers may be used the same numerals and the description is not repeated herein.

The main distinction between the embodiment of FIG. 7 and the embodiment of FIG. 5 is that a width G of the partition 124 may be different from a width G of another partition 124 in FIG. 6.

Figure 8:
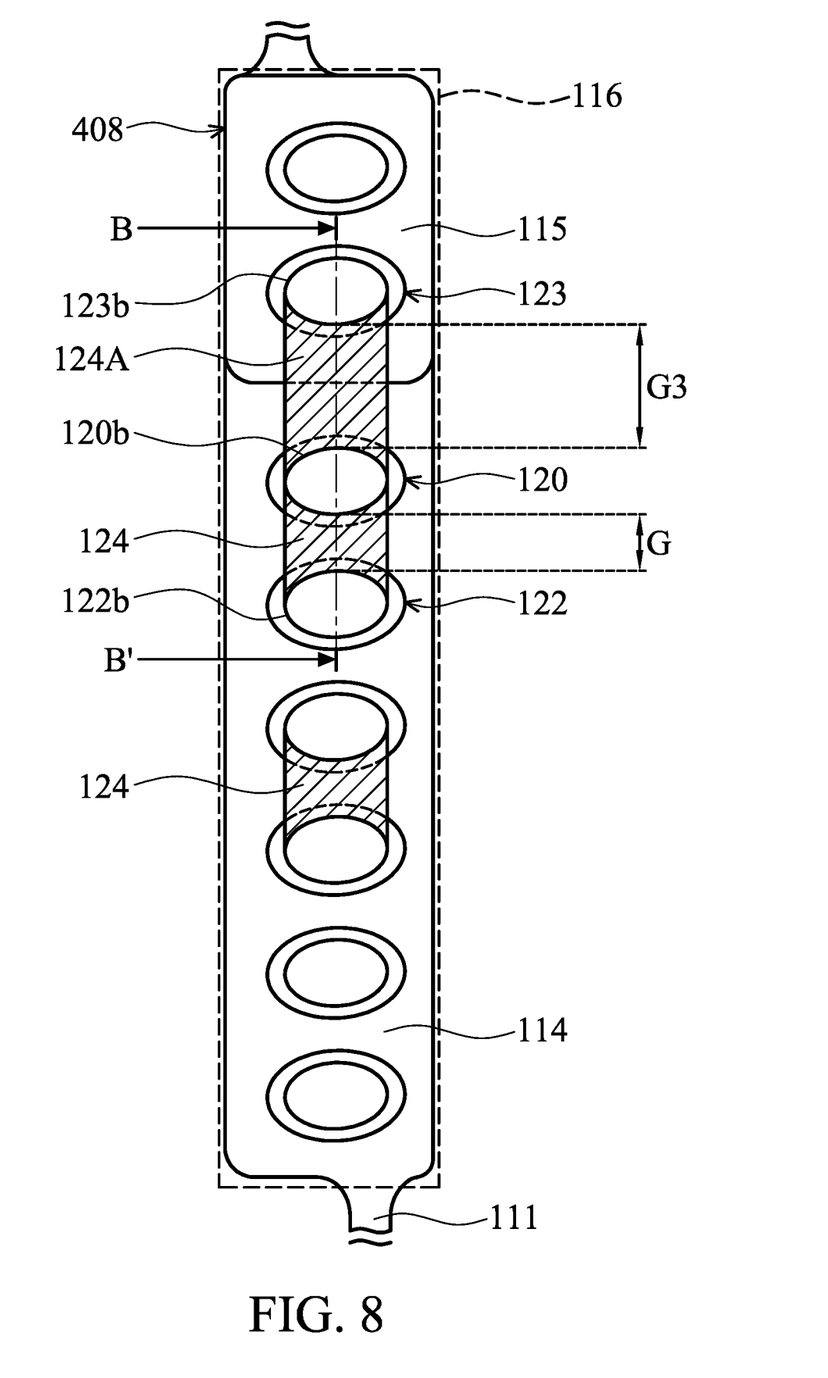
FIG. 8 is a schematic partial top-view diagram of a conductive structure in accordance with some embodiments of the present disclosure.
Figure 9:
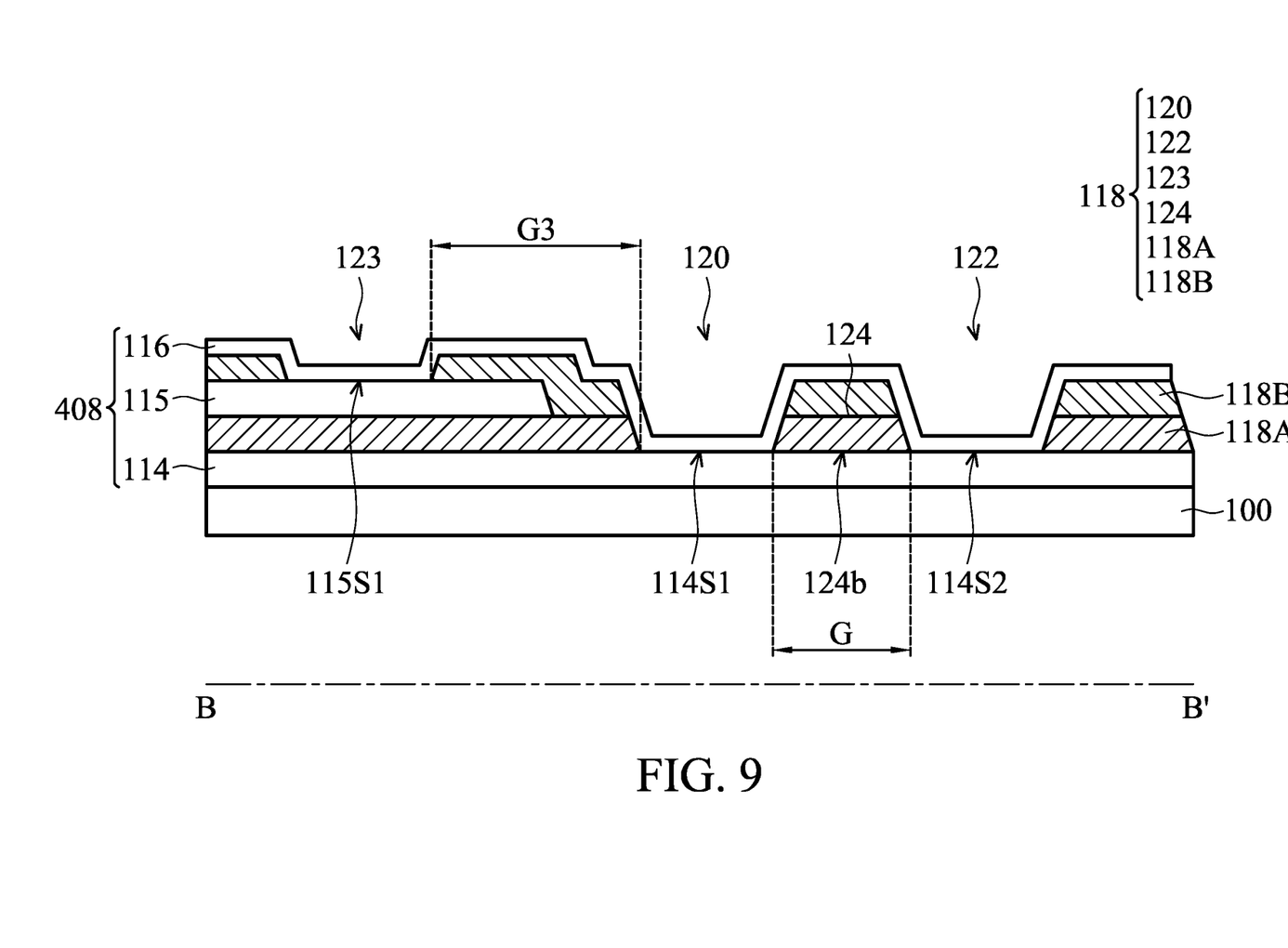
FIG. 9 is a schematic cross-sectional diagram of a conductive structure taken along a sectional line B-B' in the embodiment of FIG. 8 of the present disclosure.

Referring to FIGS. 8 and 9, in accordance with some embodiments of the present disclosure, a conductive structure 408 is provided. FIG. 8 is a schematic partial top-view diagram of the conductive structure 408. FIG. 9 is a schematic cross-sectional diagram of the conductive structure 408 taken along a sectional line B-B' in the embodiment of FIG. 8. Since the elements or the layers in the conductive structure 408 are similar to the elements or the layers in the conductive structure 108, the elements or the layers may be used the same numerals and the description is not repeated herein.

According to FIGS. 8 and 9, the conductive structure 408 may include a first conductive layer 114, a second conductive layer 116, a third conductive layer 115. In some embodiments, the third conductive layer 115 may be disposed between the first conductive layer 114 and the second conductive layer 116, and the third conductive layer 115 may overlap with a part of the first conductive layer 114 and/or a part of the second conductive layer 116 form the top view. In some embodiments, an insulating layer 118 may include a plurality sub-layers, such as a first sub-layer 118A and a second sub-layer 118B. In some embodiments, the first sub-layer 118A may be disposed between the first conductive layer 114 and the third conductive layer 115. In some embodiments, the second sub-layer 118B may be disposed on the first sub-layer 118A and disposed between the first conductive layer 114 and the second conductive layer 116. In some embodiments, a part of the second sub-layer 118B may be disposed between the third conductive layer 115 and the second conductive layer 116, and a part of the first sub-layer 118A may be disposed between the third conductive layer 115 and the first conductive layer 114. In other word, the third conductive layer 115 may be disposed between the first sub-layer 118A and the second sub-layer 118B. In some embodiments, a part of the second sub-layer 118B may be disposed between the second conductive layer 116 and the third conductive layer 115, and a part of the second sub-layer 118B may be disposed between the first sub-layer 118A and the the second conductive layer 116.

In some embodiments, the first conductive layer 114 may be electrically connected to the third conductive layer 115 through the second conductive layer 116, the second conductive layer 116 may be disposed on the first conductive layer 114 and the third conductive layer 115. The first conductive layer 114 may be electrically connected to a signal line 111 (such as a scan line or a data line) in the active region 102 (shown in FIG. 1), but it is not limited. The third conductive layer 115 may be electrically connected to a test circuit (not shown) located in the border region 104 (shown in FIG. 1), but it is not limited.

In some embodiments, the insulating layer 118 (including the first sub-layer 118A and the second sub-layer 118B) may have a first opening 120 and a second opening 122 through which the first conductive layer 114 and the second conductive layer 116 are electrically connected with each other. In some embodiments, the first opening 120 and the second opening 122 may correspond to a part of the first conductive layer 114. In some embodiments, the insulating layer 118 may further have a third opening 123 through which the third conductive layer 115 and the second conductive layer 116 are electrically connected with each other. In some embodiments, the third opening 123 may correspond to a part of the first conductive layer 114 overlapping with the third conductive layer 115. A partition 124 may be disposed or formed between the first opening 120 and the second opening 122 adjacent to the first opening 120, and another partition 124A may be disposed or formed between the third opening 123 and the first opening 120 adjacent to the third opening 123. In some embodiments, the first opening 120 and the second opening 122 may be used as vias for electrical connection between the first conductive layer 114 and the second conductive layer 116. In addition, the third opening 123 may be used as a via for electrical connection between the third conductive layer 115 and the second conductive layer 116, but it is not limited thereto. In some embodiments, the third conductive layer 115 has a third contacting surface 115S1 exposed through the third opening 123, and the second conductive layer 116 may be in contact with or electrically connected to the third contacting surface 115S1 through the third opening 123.

According to FIGS. 8 and 9, the partition 124 may have a width G as defined in the previous embodiments. In some embodiments, the another partition 124A between the first opening 120 and the third opening 123 may have a width G3. The width G3 may be approximately the same as a minimum distance between the inner contour 123b of the third opening 123 and the inner contour 120b of the forst opening 120 from the top view.

In some embodiments, the width G3 may be greater than the width G of the partition 124 between the first opening 120 and the second opening122 for reducing the opportunity of creaking or peeling of the second conductive layer 116.

Figure 10:
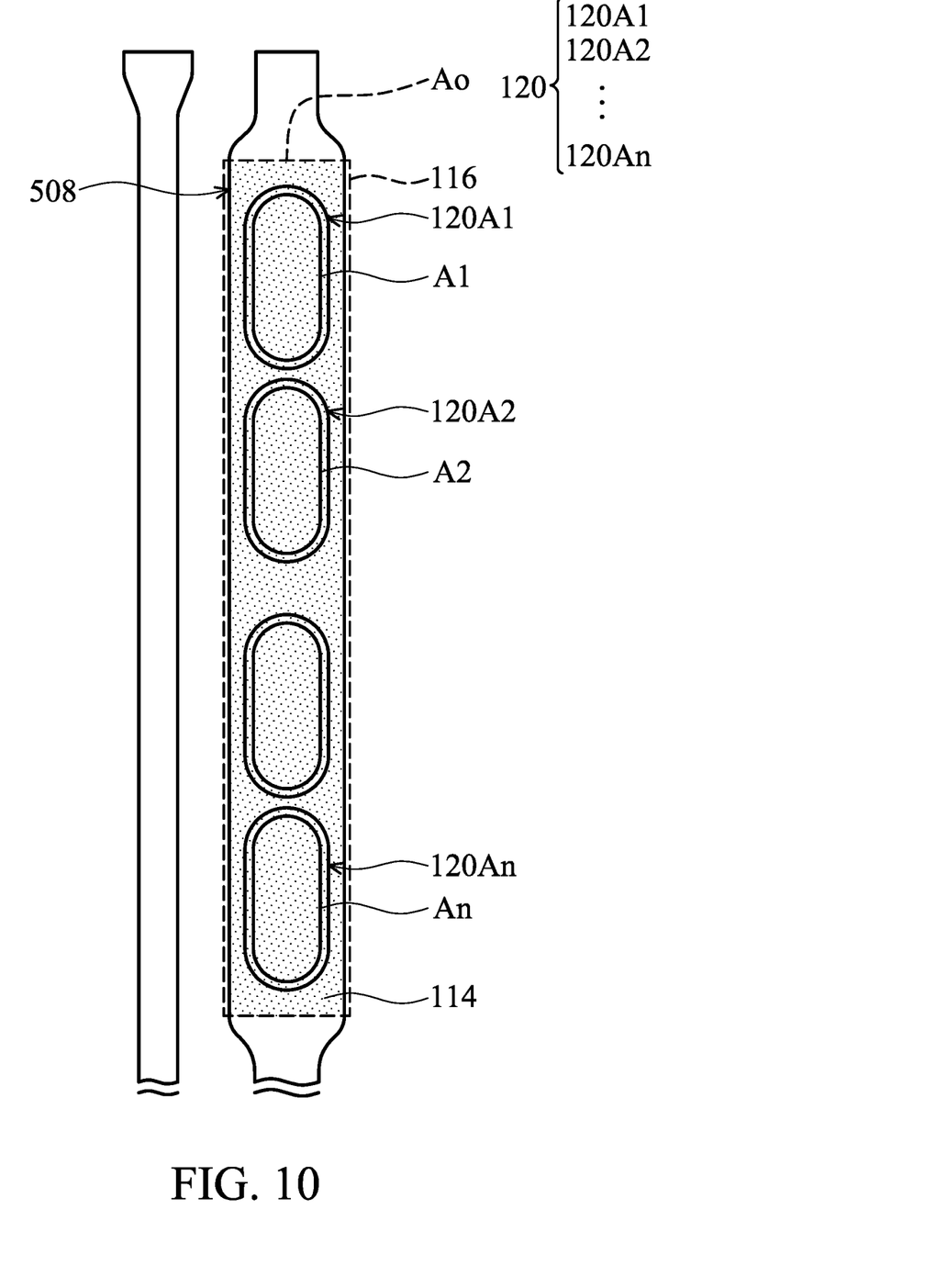
FIG. 10 is a schematic partial top-view diagram of a conductive structure in accordance with some embodiments of the present disclosure.

Referring to FIG. 10, in accordance with some embodiments of the present disclosure, a conductive structure 508 is provided. FIG. 10 is a schematic partial top-view diagram of the conductive structure 508. Since the elements or the layers in the conductive structure 508 are similar to the elements or the layers in the conductive structure 308 or the conductive structure 108, the elements or the layers may be used the same numerals and the description is not repeated herein. In some embodiments, the conductive structure 508 may include a first conductive layer 114 (e.g. a metal pad), a second conductive layer 116 (e.g a transparent conductive pad) and a plurality of openings, for example, a first opening 120A1, a second opening 120A2 . . . and an Nth opening 120An. The first conductive layer 114 may be electrically connected to the second conductive layer 116 through the openings. Each opening has an area. For example, the first opening 120A1 may have an area A1, the second opening 120A2 may have an area A2 . . . and the Nth opening 120An may have an area An. The area of the opening may be defined by an area of the corresponding contacting surface exposed by the opening from the top view. There is a total area $A_T$ which is the sum of the area A1, the area A2 . . . and the area An. The first conductive layer 114 and the second conductive layer 116 may have an overlapping area Ao. In some embodiments, the ratio of the total area $A_T$ of the openings 120 of the conductive structure 108 to the overlapping area Ao of the first conductive layer 114 and the second conductive layer 116 may be greater than or equal to 0.1 and less than 0.7 (i.e. $0.1 \leq A_T/A_O < 0.7$), such as 0.2, 0.3, 0.4, 0.5 or 0.6, but not limited thereto. The ratio of the total area $A_T$ and the overlapping area $A_O$ may be designed by the above range for the ensure proper electrical contact between the second conductive layer 118 and the first conductive layer 114.

Referring to FIGS. 2-10, the conductive structures may be used as a chip on glass (COG) bonding pad, but it is not limited.

Figure 11:
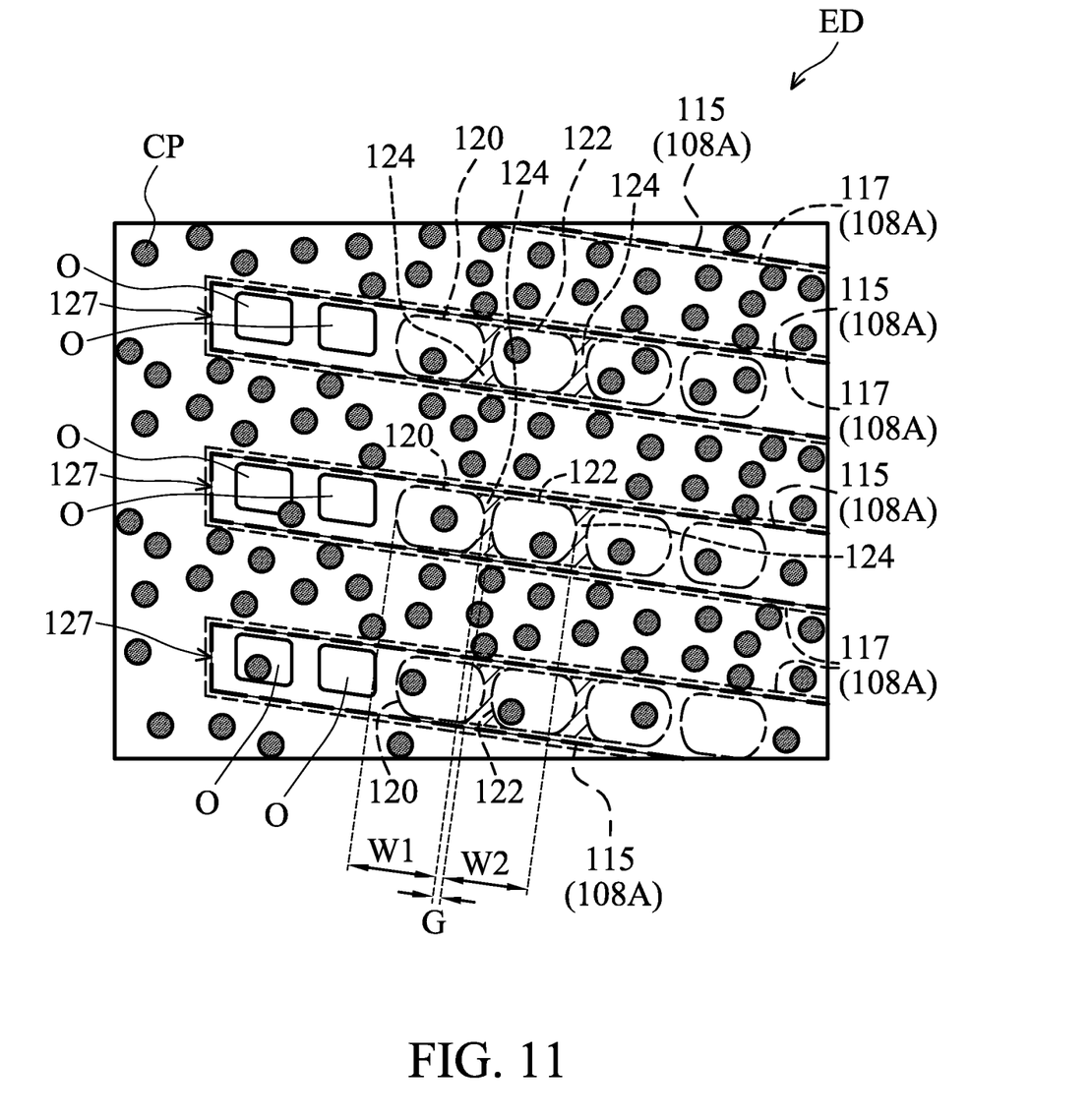
FIG. 11 is a schematic partial top-view diagram of a conductive structure in accordance with some embodiments of the present disclosure.

Referring to FIG. 11, in accordance with some embodiments of the present disclosure, a conductive structure 108A is provided. FIG. 11 is a schematic partial top-view diagram of the conductive structure 108A. Since the elements or the layers in the conductive structure 108A are similar to the elements or the layers in the conductive structure 108, the elements or the layers may be used the same numerals and the description is not repeated herein.

It should be noted that, the definitions of some parameters (such as the number of the partitions 124, the width W1 of the first opening 120, the width W2 of the second opening 122, the width G1 of the partition 124, the width G of the partition 124, the maximum width G' of the partition 124, the average height H of the partition 124 . . . ) and/or the relationship between the parameters may be the same or similar in different embodiments of the disclosure, and the description or the advantage will not be repeated herein.

Referring to FIG. 11, the conductive structure 108A may include a first conductive layer 115 and a second conductive layer 117, and an insulating layer (not shown) may be sandwiched between or disposed between the first conductive layer 115 and the second conductive layer 117, the insulating layer (not shown) has a first opening 120 and a second opening 122 through which the first conductive layer 115 and the second conductive layer 117 are electrically connected with each other. In some embodiments, the first opening 120 and the second opening 122 may be used as vias for electrical connection between the first conductive layer 115 and the second conductive layer 117, but it is not limited thereto.

In some embodiments, the conductive structure 108A may have a third conductive layer 127, and the first conductive layer 115 (indicated by the thick dashed line) may be disposed on the third conductive layer 127 (indicated by the solid line), and the first conductive layer 115 may overlap with the third conductive layer 127 form the top view. In some embodiments, another insulating layer (not shown) may be disposed between the first conductive layer 115 and the third conductive layer 127, and the another insulating layer may have at least one opening O through which the third conductive layer 127 and the first conductive layer 115 are electrically connected with each other. In some embodiments, a shape of the opening O may be different from a shape of the first opening 120 (or a shape of the second opening 122). In some embodiments, the conductive particles CP may be located in the the first opening 120, the second opening 122 or the opening O.

In FIG. 11, the first opening 120 may have a width W1, and the second opening 122 may have a width W2. The width W1 of the first opening 120 and the width W2 of the second opening 122 may have an average width W (i.e. W=(W1+W2)/2). In FIG. 11, the width G of the partition 124 may be greater than 0 and less than or equal to the average width W of the first opening 120 and the second opening 122 (i.e. $0 < G \leq W$). In some embodiments, the ratio of the width G of the partition 124 to the average width W of the first opening 120 and the second opening 122 may be greater than 0 and not more than 1 (i.e. $0 < G/W \leq 1$). In some embodiments, the ratio of the width G of the partition 124 to the average width W of the first opening 120 and the second opening 122 may be not less than 0.1 and not more than 0.85 (i.e. $0.1 \leq G/W \leq 0.85$).

The advantages of these designs are as mentioned above, the partition formed between the first opening 120 and the second opening 122 can be used as a peeling stopper. The design "$0 < G/W \leq 1$" can achieve better conductivity. In FIG. 11, the partition 124 may be in a curve shape from a top view for reducing the occurrence of peeling. In FIG. 11, the conductive structure 108A may be used as a chip-on-film (COF) bonding pad, but it is not limited.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:
    a substrate, comprising an active region and a border region adjacent to the active region,
    a plurality of pixels disposed in the active region;
    a conductive structure disposed in the border region, comprising:
    a first conductive layer;
    a second conductive layer;
    a third conductive layer disposed between the first conductive layer and the second conductive layer, wherein the third conductive layer overlaps with a part of the first conductive layer and overlaps a part of the second conductive layer; and
    an insulating layer disposed between the first conductive layer and the second conductive layer, and having a first opening and a second opening through which the first conductive layer and the second conductive layer are electrically connected with each other.

2. The electronic device as claimed in claim 1, wherein the first conductive layer comprises metal.

3. The electronic device as claimed in claim 1, wherein the second conductive layer is transparent.

4. The electronic device as claimed in claim 1, wherein from a top view, an edge of the first opening has a curved shape.

5. The electronic device as claimed in claim 1, wherein the insulating layer comprises a partition disposed between the first opening and the second opening, and a top surface of the partition and a bottom surface of the partition have different widths.

6. The electronic device as claimed in claim 1, wherein one of the plurality of pixels is electrically connected to the conductive structure.

7. The electronic device as claimed in claim 1, wherein the electronic device is a display device.

8. The electronic device as claimed in claim 1, wherein the electronic device is a liquid crystal device.

9. The electronic device as claimed in claim 1, wherein the electronic device is an organic light-emitting diode device.

* * * * *